United States Patent
Crisp

(10) Patent No.: US 7,410,060 B2
(45) Date of Patent: Aug. 12, 2008

(54) STACKABLE TRAY FOR INTEGRATED CIRCUIT CHIPS

(75) Inventor: Rodney Crisp, Kailua-Kona, HI (US)

(73) Assignee: Illinois Tool Works Inc., Glenview, IL (US)

( * ) Notice: Subject to any disclaimer, the term of this patent is extended or adjusted under 35 U.S.C. 154(b) by 418 days.

(21) Appl. No.: 11/057,343

(22) Filed: Feb. 14, 2005

(65) Prior Publication Data

US 2005/0269242 A1    Dec. 8, 2005

Related U.S. Application Data

(60) Provisional application No. 60/576,694, filed on Jun. 2, 2004.

(51) Int. Cl.
B65D 85/90    (2006.01)
B65D 85/30    (2006.01)
B65D 73/02    (2006.01)

(52) U.S. Cl. .................. 206/706; 206/725; 206/564

(58) Field of Classification Search .................. 206/710, 206/725, 722, 701, 706, 707, 712, 727, 557, 206/562, 564, 565
See application file for complete search history.

(56) References Cited

U.S. PATENT DOCUMENTS

| | | | | |
|---|---|---|---|---|
| 5,400,904 A | * | 3/1995 | Maston et al. | 206/725 |
| 5,551,572 A | * | 9/1996 | Nemoto | 206/725 |
| 5,794,784 A | * | 8/1998 | Murphy | 206/725 |
| 6,116,427 A | * | 9/2000 | Wu et al. | 206/706 |
| 6,375,408 B1 | * | 4/2002 | Carter | 414/810 |
| 6,868,970 B2 | * | 3/2005 | Gardiner et al. | 206/725 |
| 2002/0066694 A1 | | 6/2002 | Soh et al. | |
| 2003/0147229 A1 | | 8/2003 | Chen et al. | |
| 2004/0000504 A1 | * | 1/2004 | Wang | 206/725 |

FOREIGN PATENT DOCUMENTS

GB    2 279 824    1/1995

* cited by examiner

*Primary Examiner*—J. Gregory Pickett
*Assistant Examiner*—Steven A. Reynolds
(74) *Attorney, Agent, or Firm*—Day Pitney LLP

(57) ABSTRACT

A stacking tray for electrical components, such as integrated circuits, particularly those of the ball grid array (BGA) type. The tray is stackable and includes an upper side and a lower side. Both upper and lower sides of the trays include support elements forming ledges and ridges to support the integrated circuit element and stabilize the integrated circuit element in the X-Y directions. In the unstacked configuration, whether the tray is presented in the right side up or upside down configuration, the integrated circuit elements are stabilized in the X-Y directions at two diagonally opposed corners, and hence all four sides of the chip. In a stacked configuration, the laterally inwardly offset ridges of a tray immediately downwardly adjacent from the integrated circuit restrain and stabilize the integrated circuit in the X-Y directions by engaging a first pair of diagonally opposed corners of the integrated circuit.

25 Claims, 12 Drawing Sheets

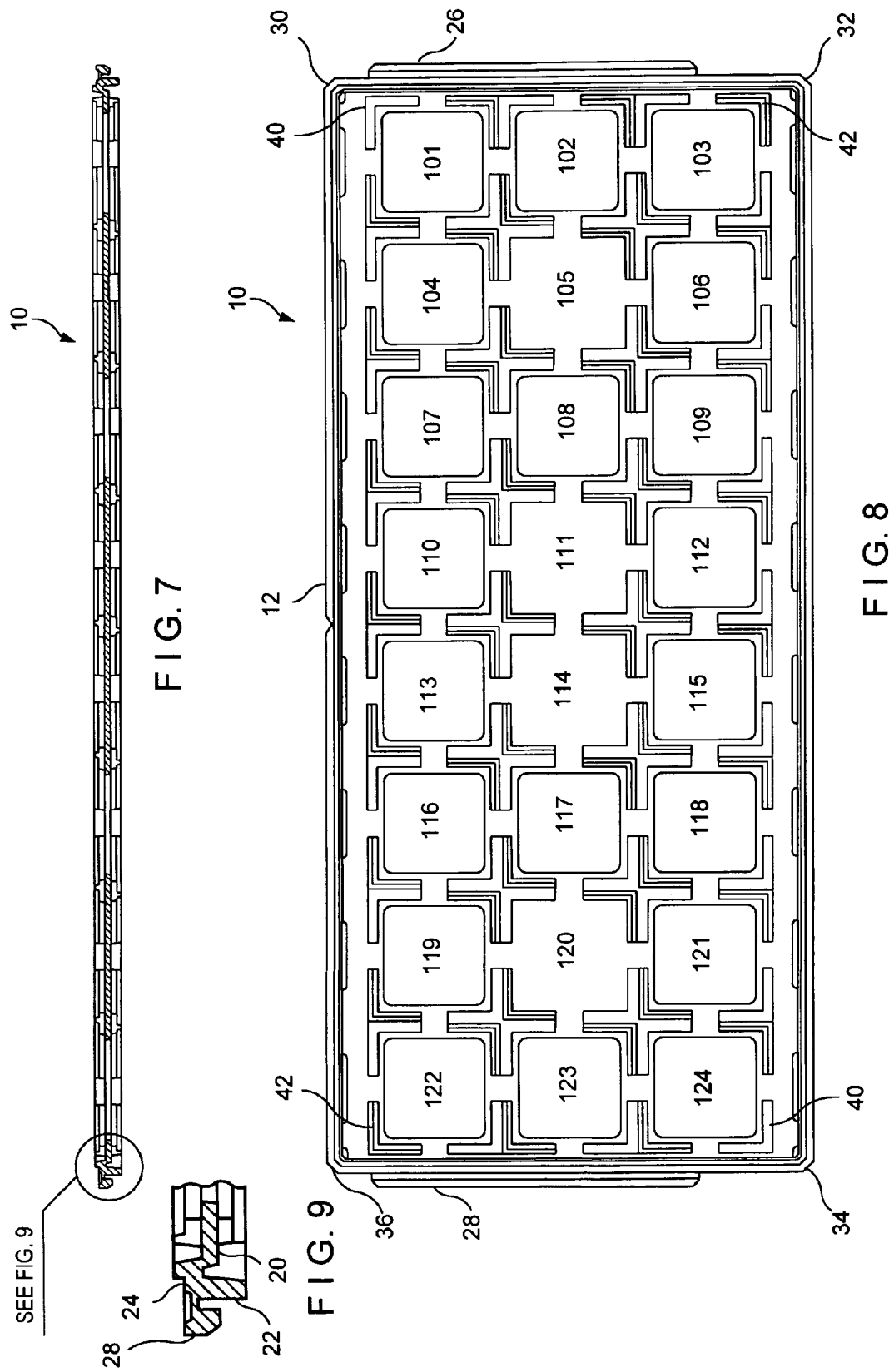

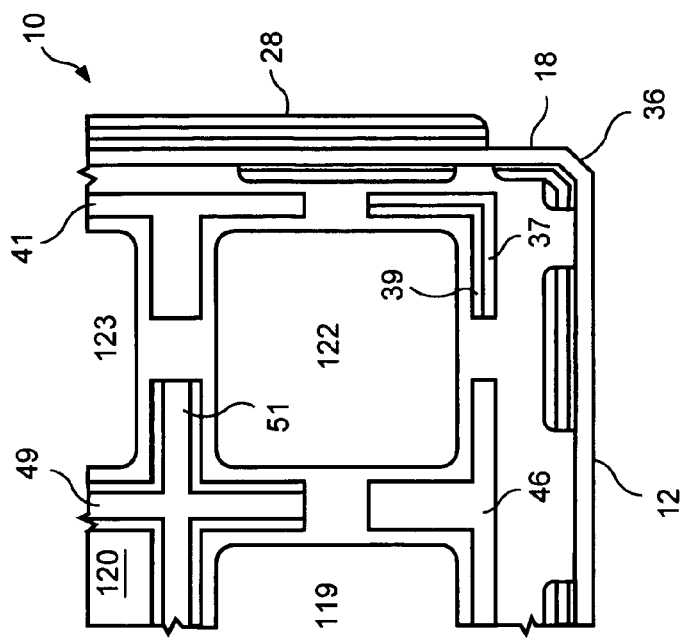
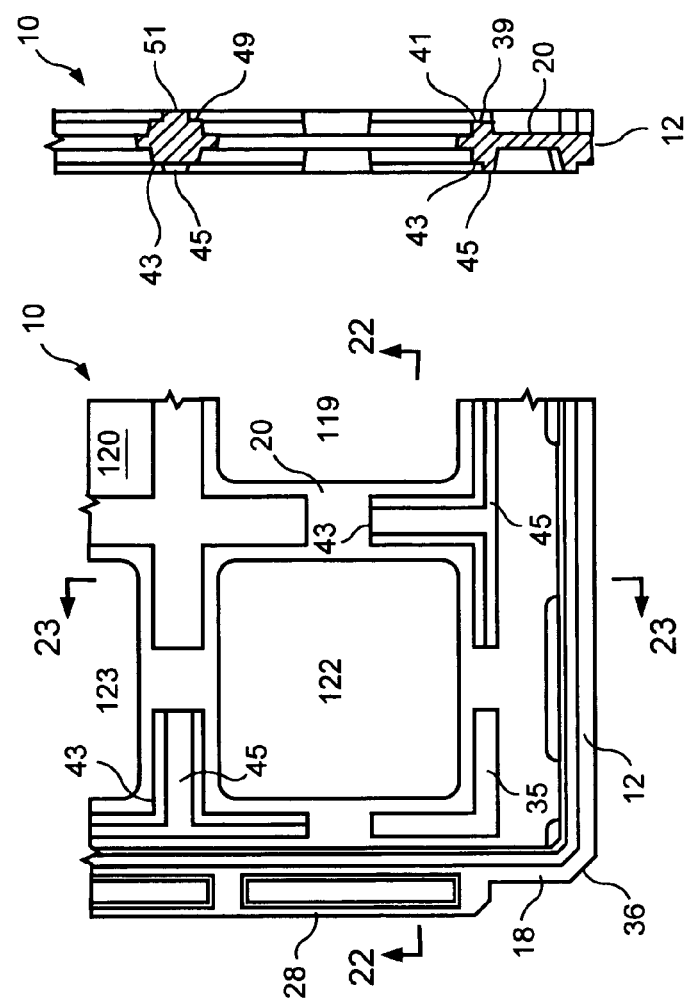
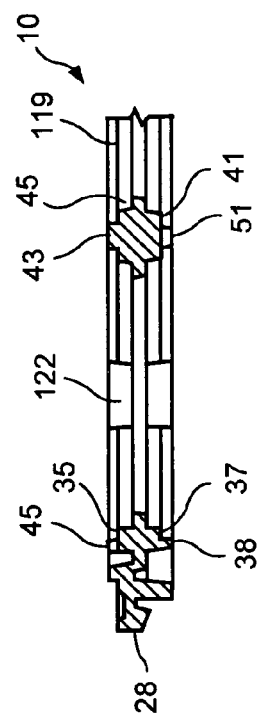

STACKABLE TRAY FOR INTEGRATED CIRCUIT CHIPS

This application claims priority from provisional application Ser. No. 60/576,694, filed on Jun. 2, 2004.

BACKGROUND OF THE INVENTION

1. Field of the Invention

The present invention relates to a tray for integrated circuits, particularly those of the ball grid array (BGA) type. The tray is stackable and includes an upper side and a lower side, wherein the upper and lower sides of each tray have storage pocket areas that align with one another when trays are stacked. More particularly, both upper and lower sides of the trays include support elements forming ledges of equal uniform height to restrain and stabilize the integrated circuit chip in the Z-direction (perpendicular to the floor) and ridges restrain and stabilize the integrated circuit chip in the X-Y direction (parallel to the floor). The ridges on one side of the tray stabilize a first pair of diagonally opposed corners of the integrated circuit chip while ridges on the other side of an adjacent tray stabilize a second pair of diagonally opposed corners of the integrated circuit chip.

2. Description of the Prior Art

In the prior art, it is known to use stackable trays for the storage and transportation of integrated circuits, particularly ball grid array (BGA) integrated circuits. These stackable trays typically form discrete storage pockets for engaging individual chips. Moreover, these trays are sometimes used as a carrier to position the chips for inspection and automated assembly apparatus. Inspection usually requires that the balls face upward whereas assembly generally requires that the balls face downward. Therefore, it is important that the integrated chips are stabilized in the X-Y directions whether the chips are in a tray that is in the right side up or upside down configuration. That is, the trays should be "flippable" or capable of supporting chips in either orientation.

Moreover, it is imperative that these trays provide substantial mechanical and electrostatic/electromagnetic protection for the chips.

Some examples of the prior art stackable trays can be found in U.S. Pat. No. 5,400,904 entitled "Tray for Ball Terminal Integrated Circuits", issued to Maston et al. on Mar. 28, 1995; U.S. Pat. No. 5,103,976 entitled "Tray for Integrated Circuits with Supporting Ribs", issued to Murphy on Apr. 14, 1992; U.S. Pat. No. 5,080,228 entitled "Integral Carrier and System for Electrical Components", issued to Maston et al. on Jan. 14, 1992; U.S. Pat. No. 5,000,697 entitled "Carrier System for PGA Electrical Components", issued to Murphy on Mar. 19, 1991; U.S. Pat. No. 4,765,471 entitled "Electrical Component Carrier", issued to Murphy on Aug. 23, 1988.

An additional example can be found in commonly owned U.S. patent application Ser. No. 10/414,617, filed on Apr. 16, 2003 entitled "Stackable Tray for Integrated Circuits with Corner Support Elements and Lateral Support Elements Forming Matrix Tray Capture System".

OBJECTS AND SUMMARY OF THE INVENTION

It is therefore an object of the present invention to provide trays which can be stacked to provide storage pockets for electronic chips, such as, but not limited to, BGA (ball grid array) chips.

It is a further object of the present invention to provide trays which can present electronic chips for automated manufacture (such as "pick and place") stabilized in the X-Y directions, whether the trays are right side up or upside down. That is, it is an object of the present invention to provide trays which are "flippable".

It is therefore a still further object of the present invention to provide trays for the storage, transportation and automated placement of electronic chips, wherein the trays provide improved mechanical, electrostatic and electromagnetic protection of the chips therewithin.

It is therefore a still further object of the present invention to provide trays for electronic chips which achieve the above-identified objects while maintaining a simple shape achieved with simple molding procedures and reduced material requirements.

These and other objects are attained by providing a tray wherein upper and lower sides of the tray include at each storage pocket of the tray, support elements with ledges of equal uniform height to stabilize the corners of integrated circuit chips in the Z-direction and ridges which stabilize the corners of integrated circuit chips in the X-Y plane. For each pair of adjacent storage pockets, with respect to one storage pocket, the ridges are laterally inwardly offset on two diagonally opposing corners to define the storage pocket for the chips and to restrain and stabilize the integrated circuits in the X-Y directions (parallel to the floor of the trays) and the ridges are laterally outwardly offset on the remaining two diagonally corners of the storage pockets to provide the X-Y stabilization in the adjacent storage pocket. The ledges on the upper surface of the tray are directly aligned with the ledges on the lower surface of the tray thereby providing stabilization in the Z-direction by capturing the chip between the ledges of support elements of adjacent trays. However, the ridges on the ledges of the upper surface of the tray are offset in an opposite lateral direction from the ridges on the ledges of the lower surface of the tray.

In the unstacked configuration, this results in the integrated circuit chip being stabilized in the X-Y directions at two diagonally opposed corners, and hence all four sides, whether the tray is presented in the right side up or upside down configuration. This is particularly important for automated placement applications, such as "pick and place".

In a stacked configuration, the laterally inwardly offset ridges of a tray immediately downwardly adjacent from the integrated circuit restrain and stabilize the integrated circuit in the X-Y directions by engaging a first pair of diagonally opposed corners of the integrated circuit. Likewise, the laterally inwardly offset ridges of a tray immediately upwardly adjacent from the integrated circuit restrain and stabilize the integrated circuit in the X-Y directions by engaging the other second pair of diagonally opposed corners of the integrated circuit. Therefore, in the stacked configuration, all four corners of the integrated circuit chip are restrained and stabilized when engaged between successive stacking trays.

A second embodiment achieves similar results by alternating between, firstly, support elements with ledges which provide Z-direction stabilization to one corner of all adjacent storage pockets and, secondly, support elements with ledges which provide Z-direction stabilization and ridges which provide X-Y stabilization to one corner of all adjacent storage pockets.

The tray conforms to JEDEC standards which sets the tray outline, storage pocket locations, outer rail height and stacking configuration which permits an integrated circuit chip seated in a full storage pocket defined by a lower tray storage pocket and an upper tray storage pocket to be restrained and stabilized in the Z direction by being between the ledges of the support elements of the immediately upwardly adjacent tray and the ledges of the support elements of the immediately downwardly adjacent tray.

DESCRIPTION OF THE DRAWINGS

Further objects and advantages of the invention will become apparent from the following description and claims, and from the accompanying drawings, wherein:

FIG. 7 is a cross-sectional view along plane 7-7 of FIG. 5.

FIG. 8 is a bottom plan view of the stackable tray of the present invention.

FIG. 9 is a detailed portion of the cross-sectional view of FIG. 7.

FIG. 21 is a plan view of a portion of the corner storage pocket formed by the upper side of the second embodiment of the stackable tray of the present invention.

FIG. 22 is a cross-sectional view along plane 22-22 of FIG. 21.

FIG. 23 is a cross-sectional view along plane 23-23 of FIG. 21.

FIG. 24 is a plan view of a portion of the corner storage pocket formed by the lower side of the second embodiment of the stackable tray of the present invention.

DETAILED DESCRIPTION OF THE PREFERRED EMBODIMENT

Figure 1:
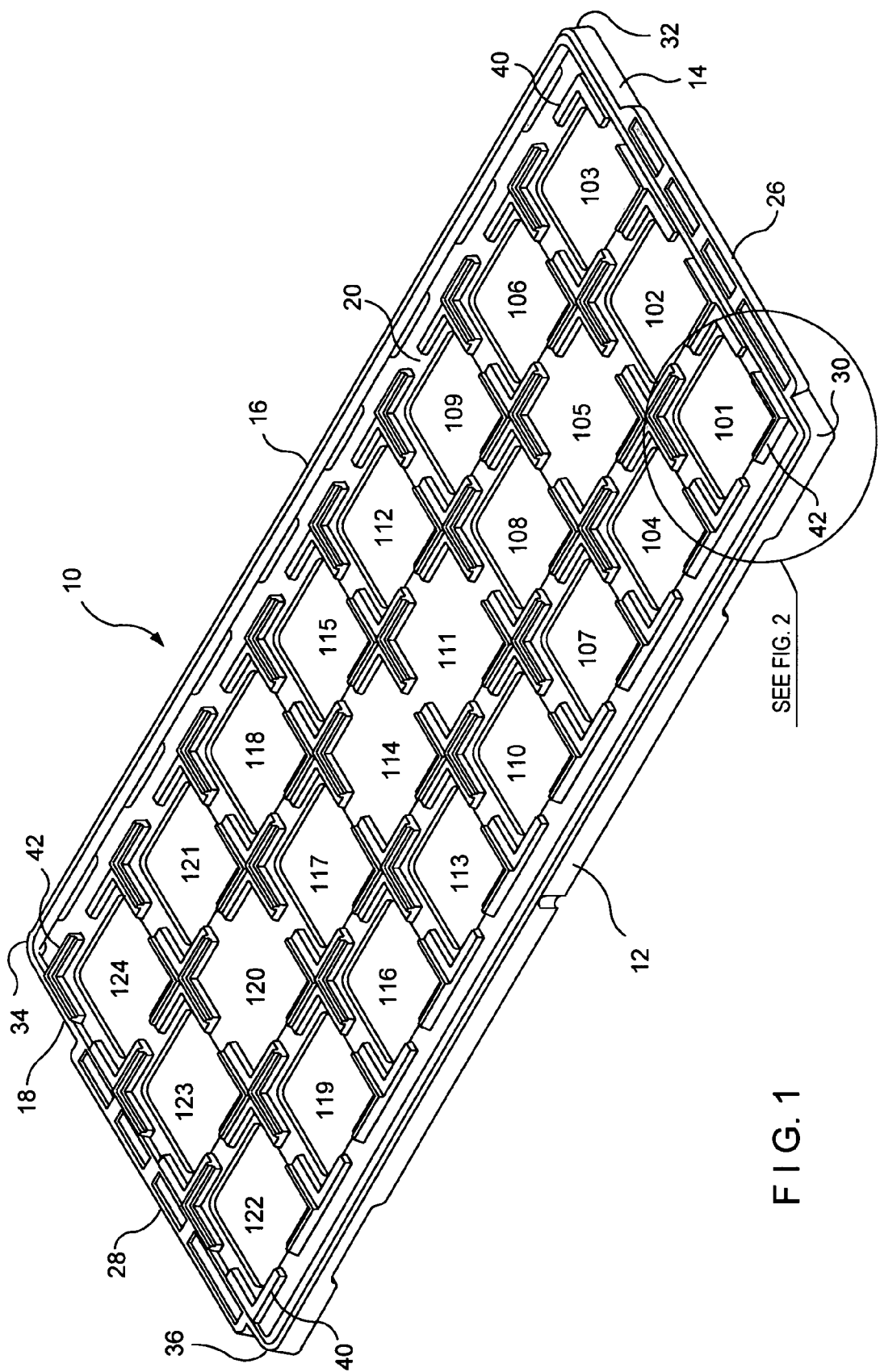
FIG. 1 is a top perspective view of the stackable tray of the present invention.

Referring now to the drawings in detail wherein like numerals indicate like elements throughout the several views, one sees that FIG. 1 is a top perspective view of the tray 10 of the present invention. Tray 10 conforms to the standards of JEDEC and hence is bounded by long sides 12, 16 and short sides 14, 18 with interior structure provided by planar floor 20. Sides 12, 14, 16, 18 are bounded by downwardly extending peripheral skirt 22 (see FIG. 9) which further includes upper indentation 24 for receiving the peripheral skirt 22 of an upwardly adjacent tray thereby allowing the trays 10 to be stacked. Flanges 26, 28 are provided on short sides 14, 18 offset from one another in accordance with JEDEC to provide indication of the front and back of the tray. As noted, the entire peripheral structure, including peripheral skirt 22, upper indentation 24 and flanges 26, 28, is made in accordance with JEDEC standards to provide for standardized automated handling of tray 10.

Corner 30 is formed at the intersection of sides 12, 14. Corner 32 is formed at the intersection of sides 14, 16. Corner 34 is formed at the intersection of sides 16, 18. Corner 36 is formed at the intersection of sides 12, 18. Flat (that is, without ridges) L-shaped support elements 40 are formed on the upper surface (FIGS. 1, 5 and 10) inwardly adjacent from corners 32, 36 and are formed on the lower surface (FIGS. 3 and 8) inwardly adjacent from corners 30, 34. Ridged L-shaped support elements 42 are formed on the upper surface (FIGS. 1, 2 and 5) inwardly adjacent from corners 30, 34 and are formed on the lower surface (FIGS. 3, 4, 8 and 13) inwardly adjacent from corners 32, 36. T-shaped support elements 44 are formed inwardly adjacent from sides 12, 14, 16, 18, and X-shaped support elements 46 are formed in the interior of tray 10 thereby defining storage pockets 101-124 which are configured in rows and columns within the rectangular shape of tray 10, which could likewise be provided in a square or other shape. Storage pockets 105, 111, 114, 120 include a solid planar floor 20 thereby forming vacuum storage pockets to permit vacuum operated equipment to couple to the tray whereas the remaining storage pockets have a substantial portion of planar floor 20 removed.

Figure 2:
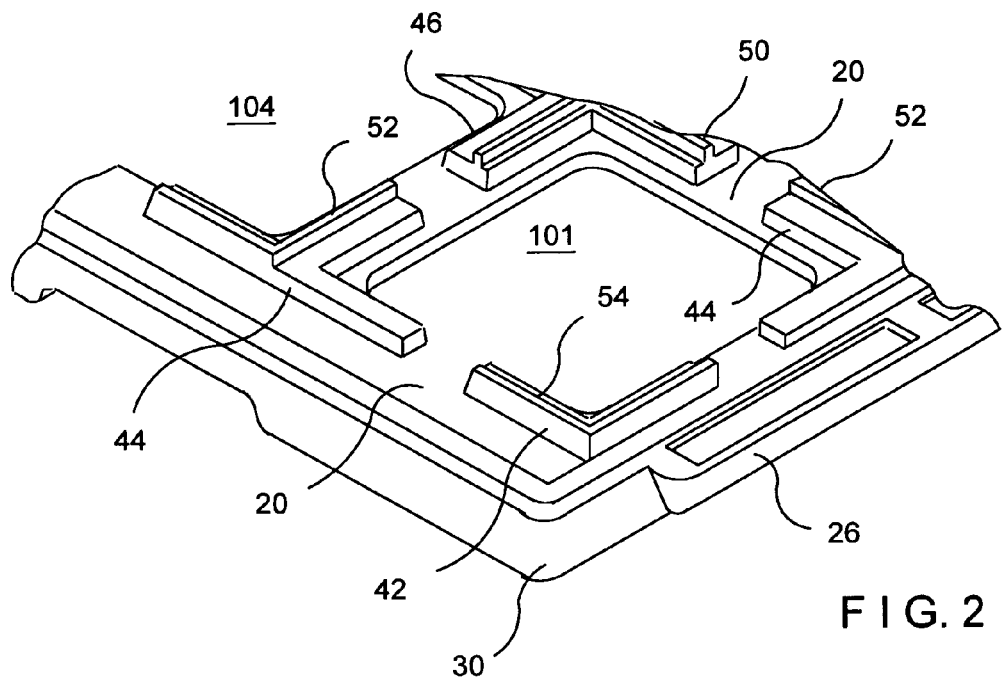
FIG. 2 is a detailed portion of the perspective view of FIG. 1.
Figure 4:
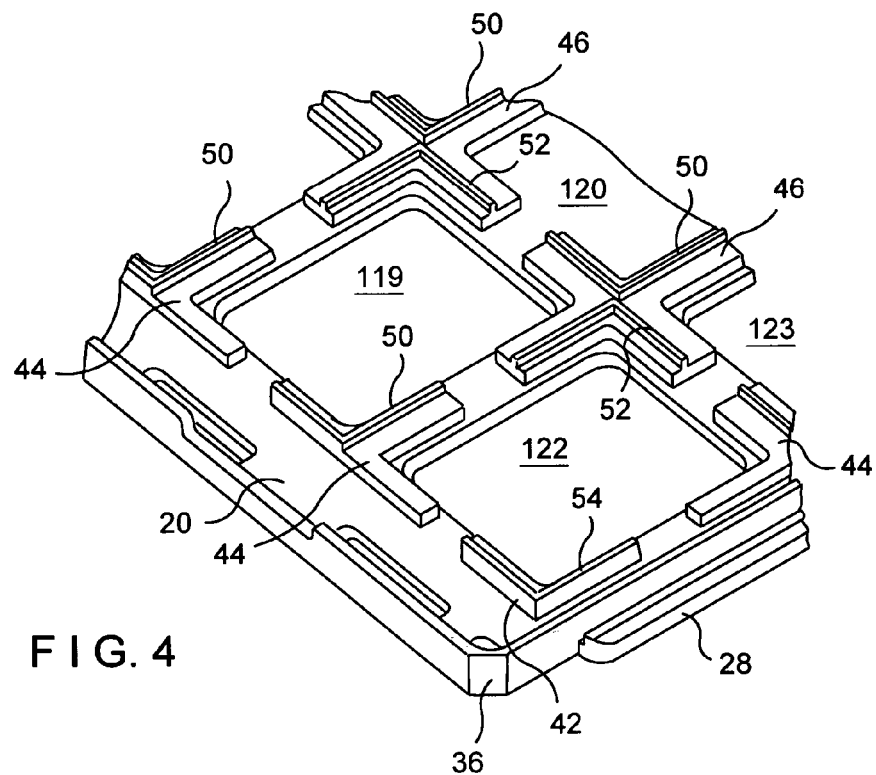
FIG. 4 is a detailed portion of the perspective view of FIG. 3.
Figure 3:
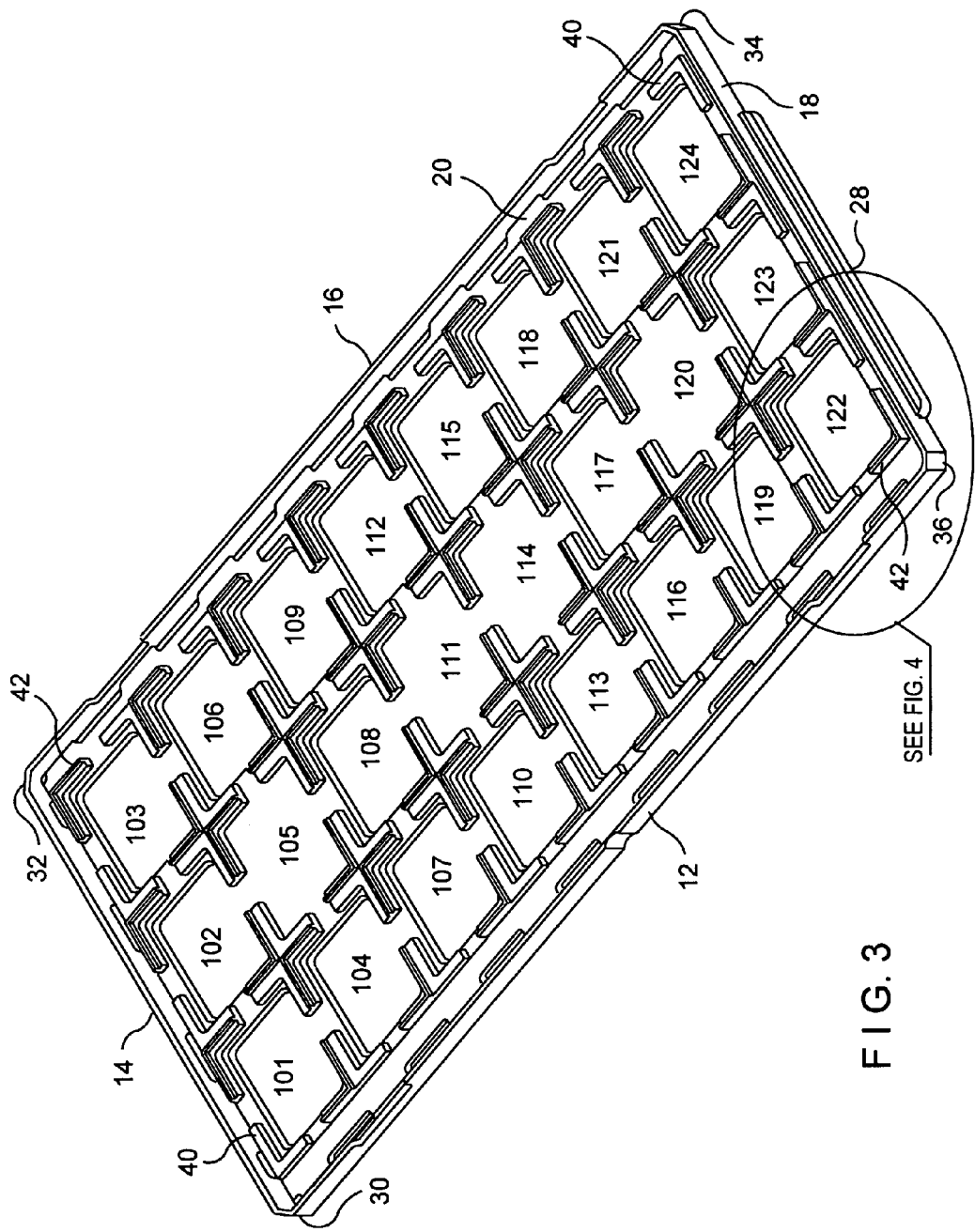
FIG. 3 is a bottom perspective view of the stackable tray of the present invention.
Figures 5, 6:
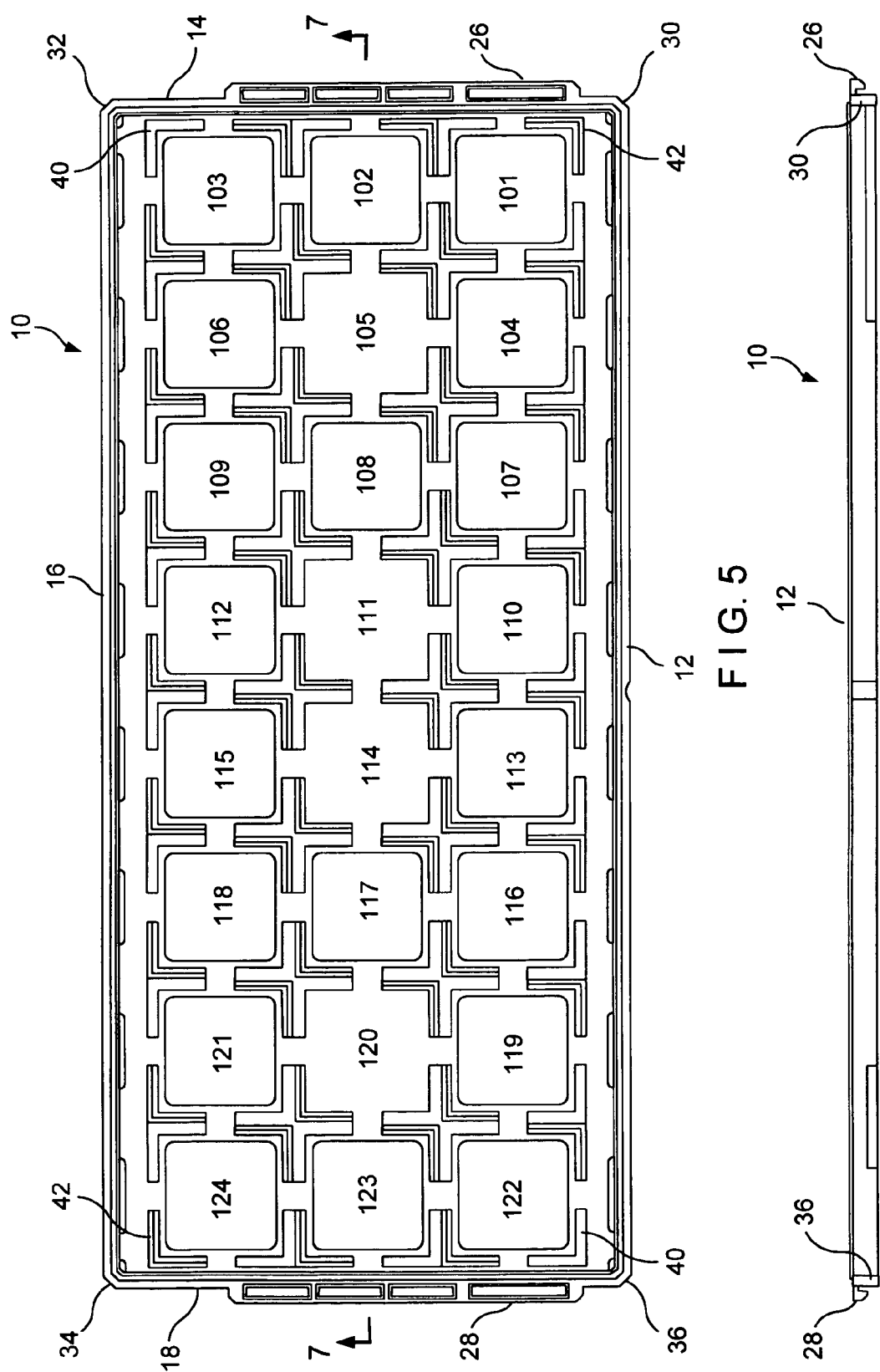
FIG. 5 is a top plan view of the stackable tray of the present invention.
FIG. 6 is a side plan view of the stackable tray of the present invention.
Figure 13:
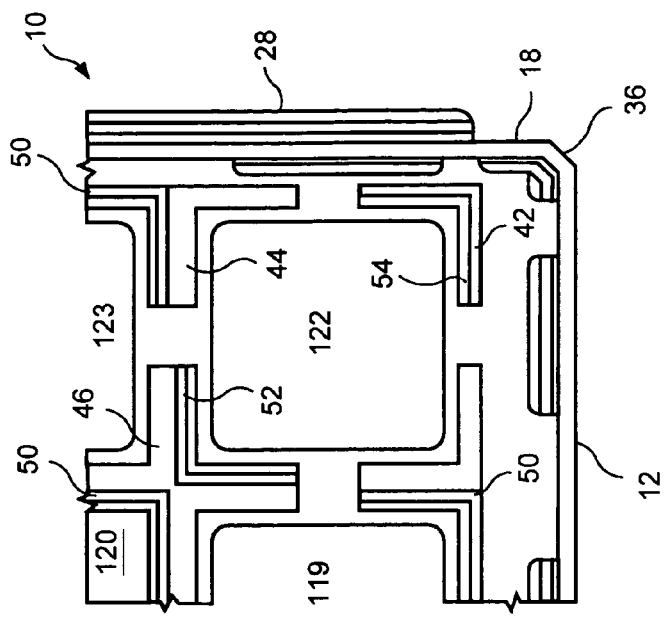
FIG. 13 is a plan view of a portion of the corner storage pocket formed by the lower side of the stackable tray of the present invention.
Figure 12:
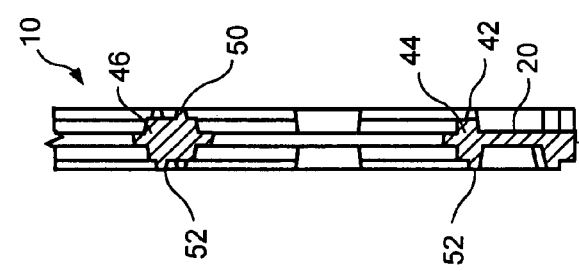
FIG. 12 is a cross-sectional view along plane 12-12 of FIG. 10.
Figure 10:
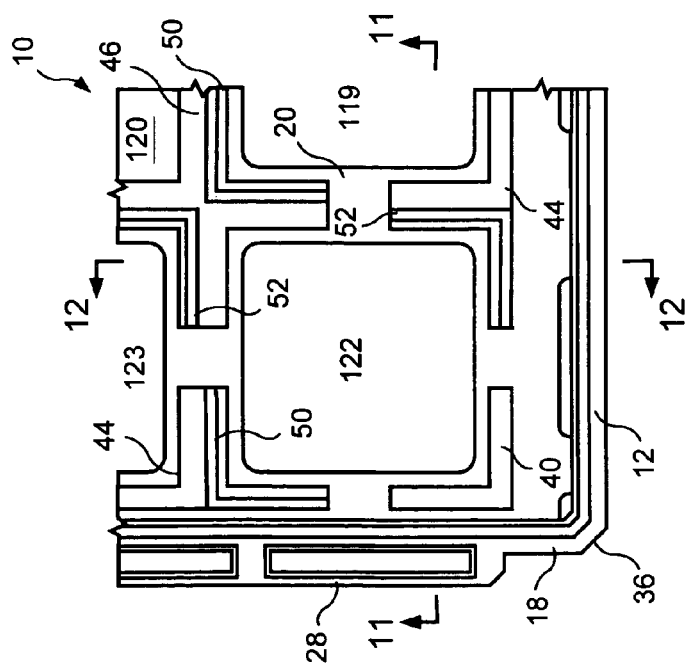
FIG. 10 is a plan view of a portion of the corner storage pocket formed by the upper side of the stackable tray of the present invention.
Figure 14:
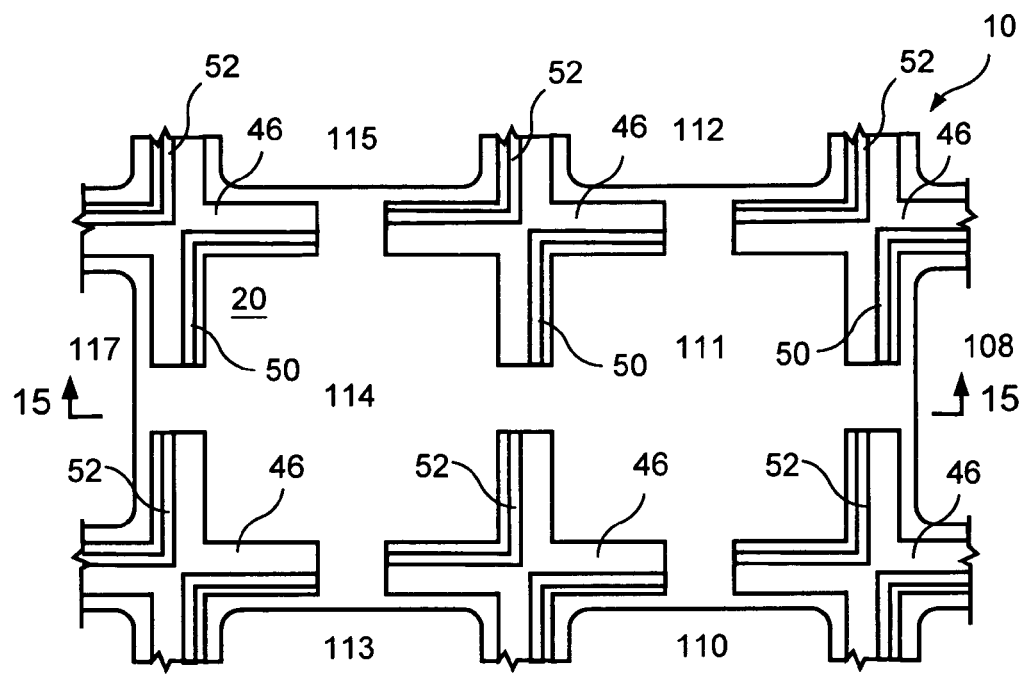
FIG. 14 is a plan view of an interior portion of the upper side of the stackable tray of the present invention, including the interior vacuum chambers.
Figure 15:
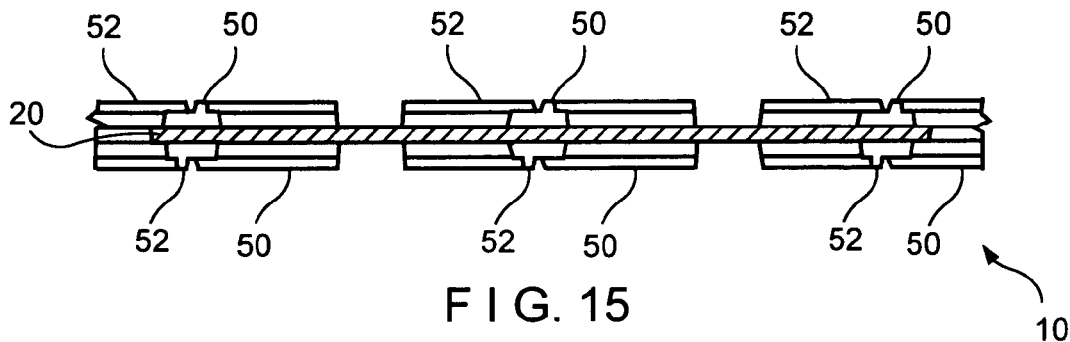
FIG. 15 is a cross-sectional view along plane 15-15 of FIG. 14.
Figure 16:
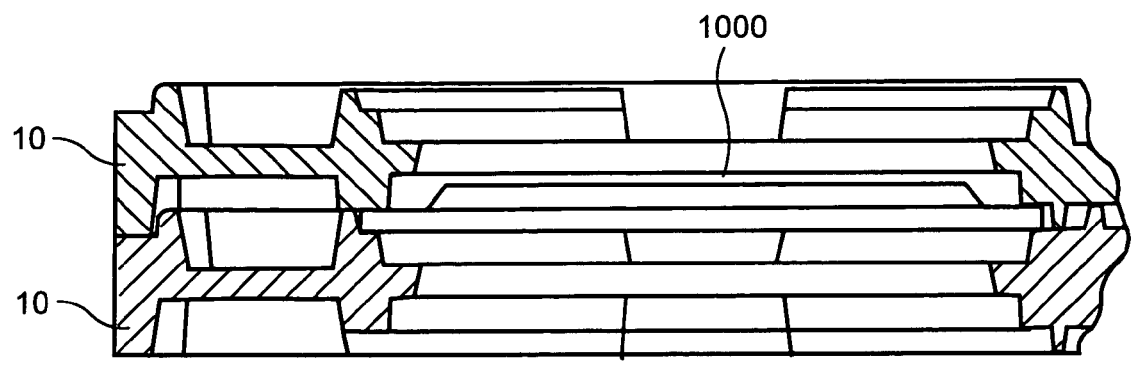
FIG. 16 is a cross-sectional view of two stacked trays of the present invention, with an integrated circuit engaged therebetween.

As seen in FIGS. 5, 8, 10 and 13, X-shaped support elements 46 include two laterally offset L-shaped ridges 50, 52. Laterally offset L-shaped ridges 50, 52 are oriented to be laterally inwardly offset for a given storage pocket and hence serving to stabilize a chip in that pocket while being laterally outwardly offset for an adjacent storage pocket and hence not serving a stabilizing function for the adjacent pocket. For instance, in FIG. 10, laterally offset L-shaped ridge 50 is laterally inwardly offset for storage pocket 119 so as to capture the corners of a chip in pocket 119, but is laterally outwardly offset for storage pockets 120, 122 thereby serving little or no stabilizing function for a chip in these pockets. Likewise, laterally offset L-shaped ridge 52 of FIG. 10 is laterally inwardly offset for storage pocket 123 but is laterally outwardly offset for storage pockets 120, 122. This sequence of alternating inwardly and outwardly lateral offset is likewise well-illustrated in FIG. 14. Similarly, ridged L-shaped support elements 42 include laterally offset L-shaped ridges 54 which, as shown in FIGS. 1 and 2, are configured to be diagonally opposite from laterally inwardly offset L-shaped ridges 52 on the upper surface in storage pockets 101 and 124 and, as shown in FIGS. 3, 4 and 13, are configured to be diagonally opposite from laterally inwardly offset L-shaped ridges 52 on the lower surface in storage pockets 103 and 122. Likewise, T-shaped support elements 44, as shown in FIGS.

10 and 13 include laterally offset L-shaped ridges 50 or 52 to be laterally inwardly offset at the diagonally opposing corner of a similar laterally inwardly offset L-shaped ridge 50 or 52 for a given storage pocket.

Figure 11:
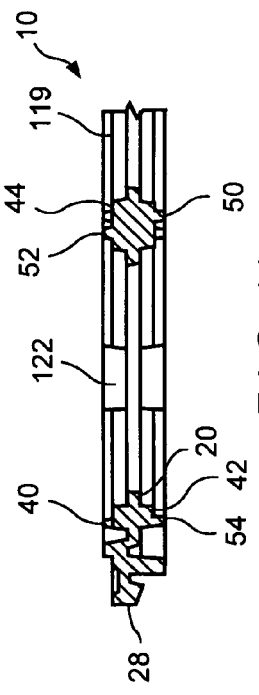
FIG. 11 is a cross-sectional view along plane 11-11 of FIG. 10.
Figure 17:
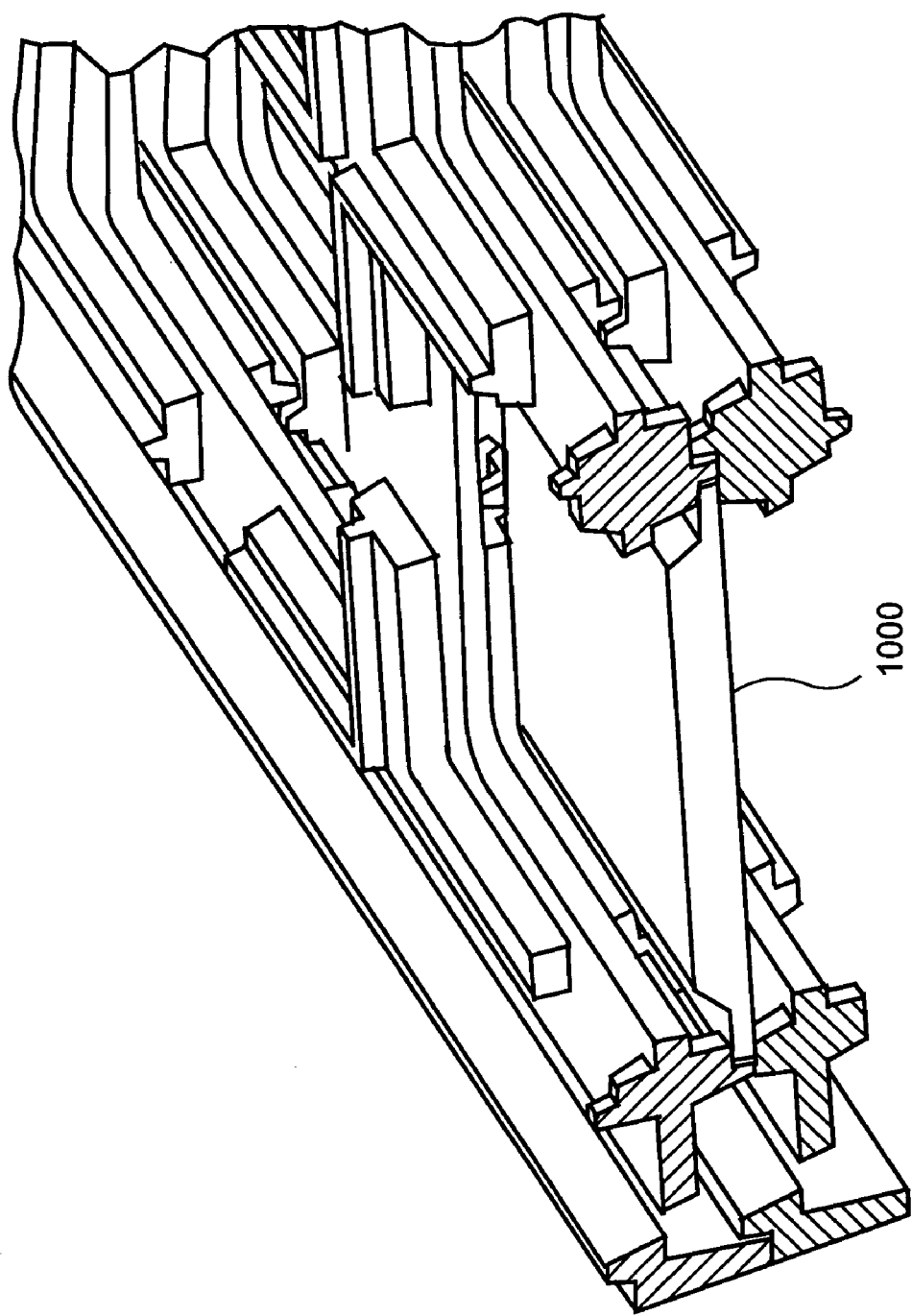
FIG. 17 is a perspective view of two stacked trays of the present invention, with an integrated circuit engaged therebetween.
Figure 18:
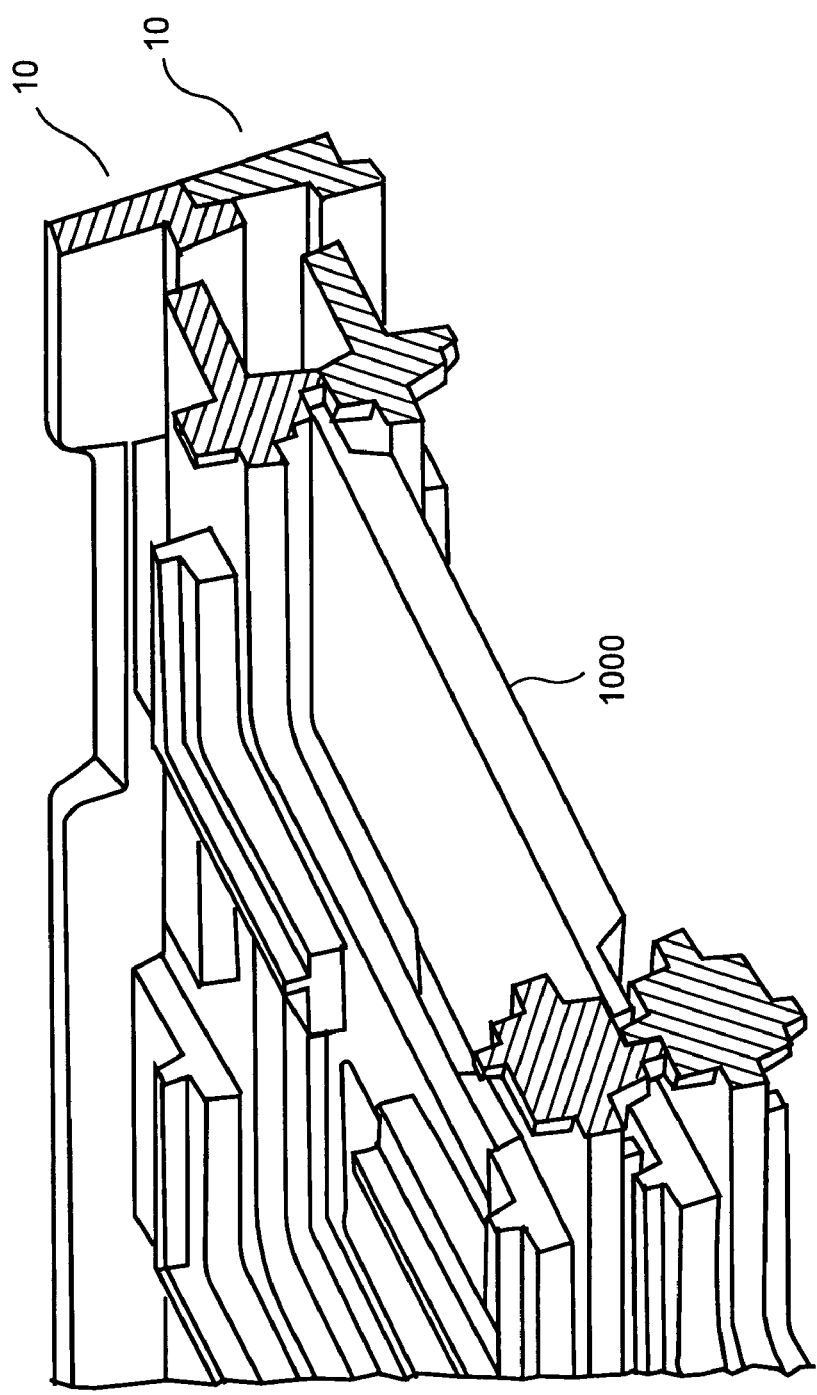
FIG. 18 is a perspective view of two inverted stacked trays of the present invention, with an integrated circuit engaged therebetween.
Figure 19:
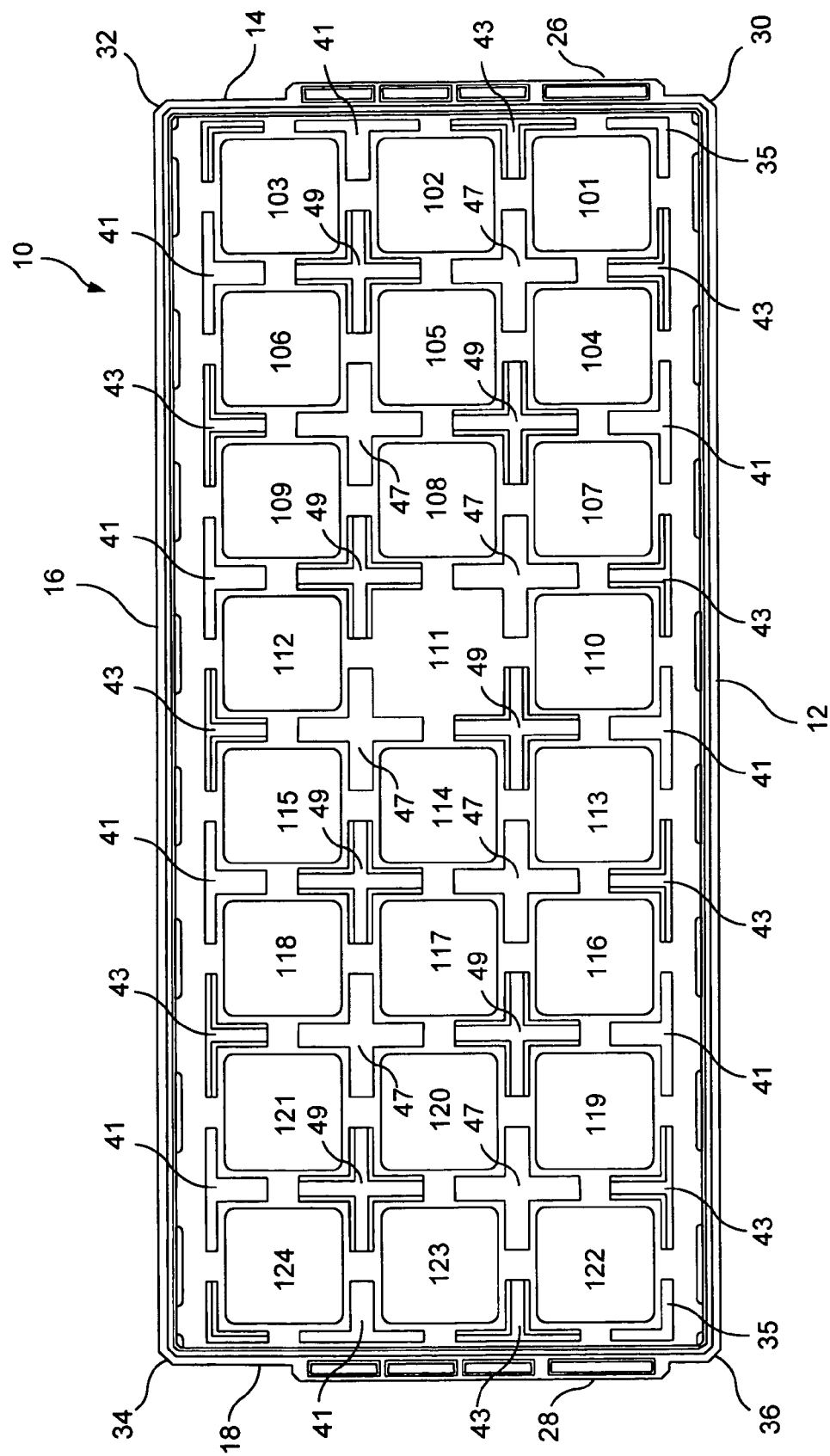
FIG. 19 is a top plan view of the second embodiment of the stackable tray of the present invention.
Figure 20:
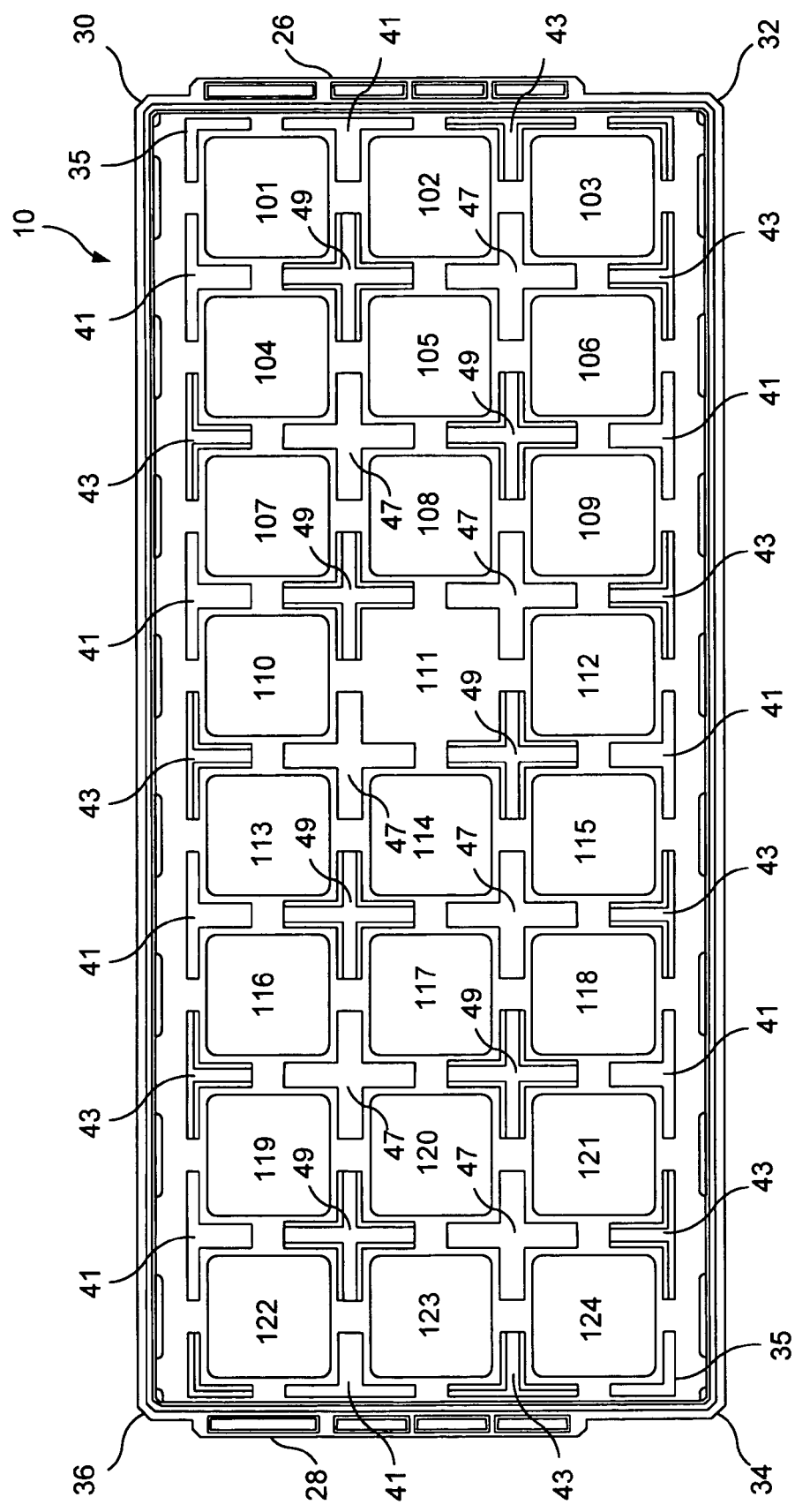
FIG. 20 is a bottom plan view of the second embodiment of the stackable tray of the present invention.

As can be seen from the cross-sectional views of FIGS. 11, 12, 15 and 16 and perspective views 17 and 18, the orientation of the laterally offset L-shaped ridges 50, 52 alternates between the top side of the tray 10 and the bottom side of the tray 10, just as it alternates between adjacent storage pockets. Specifically, as seen in FIG. 11, for the X-shaped support element 44 shown, on the top side, L-shaped ridge 52 is laterally inwardly offset with respect to storage pocket 122 and outwardly offset with respect to storage pocket 119 while, on the bottom side, L-shaped ridge 50 is outwardly offset with respect to storage pocket 122 and inwardly offset with respect to storage pocket 119. The resulting stacked structure, which can be used for shipping and transportation, provides that an integrated circuit chip 1000 (see FIGS. 16-18) is laterally supported and stabilized in the X-Y direction within a storage pocket by having a first pair of diagonally opposed corners engaged by the laterally inwardly offset ridges 50, 52 of an immediately upwardly adjacent tray 10 and by having a second pair of diagonally opposed corners engaged by the laterally inwardly offset ridges 50, 52 of an immediately downwardly adjacent tray 10.

Therefore, in this stacked configuration, all four corners of an integrated circuit chip 1000 are supported and stabilized in the X-Y directions by successive stacking trays 10. Similarly, the integrated circuit chip 1000 is stabilized in the Z-direction (perpendicular to stacking tray) 10 by being engaged between the ledges formed by the support elements 40, 42, 44, 46 of adjacent stacking trays.

Moreover, when the trays 10 are unstacked, whether in a right side up or upside down configuration, the integrated circuit chips 1000 are stabilized in the X-Y direction at two diagonally opposed corners, thereby stabilizing all four sides of the chip. That is, the trays are "flippable". This is particularly useful for automated placement of the integrated circuit chips 1000, such as in a "pick and place" operation.

A second embodiment of tray 10 is disclosed in FIGS. 19-24. In this embodiment, X-shaped support elements alternate between X-shaped support elements 47 without support ridges (see FIG. 21) and X-shaped support elements 49 with X-shaped support ridges 51 (see FIG. 24). In this embodiment, the X-shaped support elements 47 (without support ridges) provide ledges for stabilization in only the Z-direction to integrated circuit chips in one corner of each of the four adjacent storage pockets. However, the X-shaped support elements 49 provide ledges for stabilization in the Z-direction and X-shaped ridges 51 provide stabilization in the X-Y direction to integrated circuit chips in one corner of each of the four adjacent storage pockets. Similarly, T-shaped support elements alternate between T-shaped support elements 41 without support ridges (see FIG. 24) and T-shaped support elements 43 with T-shaped support ridges 45 (see FIG. 21). The T-shaped support elements 41 (without ridges) provide ledges for stabilization in only the Z-direction to integrated circuit chips in one corner of each of the two adjacent storage pockets. Likewise, the T-shaped support elements 43 provide ledges for stabilization in the Z-direction and T-shaped support ridges 45 provide stabilization in the X-Y direction to integrated circuit chips in one corner of each of the two adjacent storage pockets.

As shown in FIGS. 19-24, L-shaped support elements 35 without support ridges are provided in corner storage pockets diagonally opposite from X-shaped support elements 47 (without support ridges). See storage pockets 101 and 122 in FIG. 19, the top view of the tray; storage pockets 103 and 124 in FIG. 20, the bottom view of the tray; and storage pocket 122 in FIG. 21, a detailed top view of the tray. Likewise, L-shaped support element 37 with L-shaped support ridges 39 are provided in corner storage pockets diagonally opposite from X-shaped support elements 49 (with support ridges 51). See storage pockets 103 and 124 in FIG. 19, the top view of the tray; storage pockets 101 and 122 in FIG. 20, the bottom view of the tray; and storage pocket 122 in FIG. 24, a detailed bottom view of the tray). The L-shaped support elements 35 (without support ridges) provide ledges for stabilization in only the Z-direction to the outward corner of integrated circuit chips in the adjacent corner storage pockets. Likewise, the L-shaped support elements 37 provide ledges for stabilization in the Z-direction and L-shaped support ridges 39 provide stabilization in the X-Y direction to the outward corner of integrated circuit chips in the adjacent corner storage pockets.

The resulting configuration, when the trays of the second embodiment are stacked, results in all four corners of the integrated circuit chips stored therewithin to be stabilized in the X-Y direction at a first pair of diagonally opposite corners by the support elements of an upper tray and in the X-Y direction at a second pair of diagonally opposite corners by the support elements of a lower tray. Likewise, all four corners are stabilized in the Z-direction by the ledges of the support elements of both the upper tray and lower tray. Moreover, similarly to the first embodiment, the second embodiment provides a "flippable" configuration, and can be used in automated operations, such as "pick and place".

Depending upon the thickness of the integrated circuit chip being stabilized, the thickness of the various support elements may vary as the integrated circuit chip is stored or stabilized between the support elements of two adjacent trays 10. In the preferred embodiment, the integrated circuit chip is stored or stabilized at each corner by one support element with a support ridge and a like support element without a support ridge. That is, a support element with a support ridge is formed on the upper side of the tray directly above a like support element without a support ridge, and vice versa.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A tray for integrated circuit chips comprising:
   a plurality of storage pockets, said storage pockets having a center and being bounded by first and second pairs of diagonally opposed corners, each of said diagonally opposed corners including support elements;
   said support elements including ledges to stabilize integrated circuit chips in a direction perpendicular to the tray;
   said ledges at said first pair of diagonally opposed corners including ridges which are inwardly offset, said ridges of said first pair being spaced a first distance from said center of said storage pocket so as to extend into said storage pocket to stabilize a first pair of diagonally opposed corners of the integrated circuit chip within said storage pocket in directions parallel to the tray;
   said ledges at said second pair of diagonally opposed corners including ridges which are outwardly offset, said ridges of said second pair being spaced a second distance from said center of said storage pocket, said second distance being greater than said first distance, so as to be free of contact with a second pair of diagonally opposed corners of the integrated circuit chip within the storage pocket and to extend into adjacent storage pockets thereby forming ridges of said first pair of diagonally opposed corners of adjacent storage pockets.

2. The tray for integrated circuit chips of claim 1 wherein the tray is stackable with sequential like trays.

3. The tray for integrated circuit chips of claim 2 including an upper side and a lower side, wherein an upper side of a tray joins with a lower side of a successively upper tray thereby forming aligning respective storage pockets to store integrated chips therebetween.

4. The tray for integrated circuit chips of claim 3 wherein when a lower tray is stacked and aligned with an upper tray whereby integrated chips are stored therebetween, storage pockets of an upper side of the lower tray include inwardly offset ridges to engage a first pair of diagonally opposing corners of chips stored between the trays and storage pockets of a lower side of the upper tray include inwardly offset ridges to engage a second pair of diagonally opposing corner of chips stored between the trays thereby stabilizing the chips in directions parallel to the trays.

5. The tray for integrated circuit chips of claim 4 whereby said first pair of diagonal corners of chips is engaged by inwardly offset ridges of the lower tray and said second pair of diagonal corners of chips are engaged by inwardly offset ridges of the upper tray, thereby making a resulting configuration flippable.

6. The tray for integrated circuits of claim 5 wherein chips stored between an upper and a lower tray are engaged between said ledges of said support elements of the upper and lower trays thereby stabilizing the chips in a direction perpendicular to the tray.

7. The tray for integrated circuit chips of claim 6 wherein said support elements on said upper side are directly above said support elements on said lower side.

8. The tray for integrated circuit chips of claim 7 wherein support elements with inwardly offset ridges on said upper side are directly above support elements with outwardly offset ridges on said lower side.

9. The tray for integrated circuit chips of claim 8 wherein X-shaped support elements are formed at an intersection of four storage pockets, T-shaped support elements are formed at an intersection of two storage pockets along sides of the tray and L-shaped support elements are formed at outward corners of corner storage pockets.

10. The tray for integrated circuit chips of claim 9 wherein the tray is rectangular with rows and columns of storage pockets.

11. The tray for integrated circuit chips of claim 10 including a planar floor for supporting said support elements.

12. The tray for integrated circuit chips of claim 11 wherein said planar floor is solid through at least a portion of said storage pockets thereby forming vacuum storage pockets to permit vacuum operated equipment to couple to the tray.

13. A tray for integrated circuit chips comprising:
a plurality of storage pockets, said storage pockets having a center and being bounded at corners thereof by support elements;
said support elements including ledges to stabilize integrated circuit chips in a direction perpendicular to the tray;
said ledges of at least a portion of said support element including ridges at a first pair of diagonally opposing corners of each storage pocket spaced a first distance from said center to stabilize integrated circuit chips in directions parallel to the tray and ridges at a second pair of diagonally opposing corners of each storage pocket which are spaced a second distance from said center to be free of engagement with the integrated circuit chip within the storage pocket and to stabilize corners of integrated circuit chips in adjacent storage pockets in directions parallel to the tray, wherein said second distance is greater than said first distance.

14. The tray for integrated circuit chips of claim 13 wherein said support elements alternate between including said ridges and being free of said ridges.

15. The tray for integrated circuit chips of claim 14 wherein the tray is stackable with sequential like trays.

16. The tray for integrated circuit chips of claim 14 including an upper side and a lower side, wherein an upper side of a tray joins with a lower side of a successively upper tray thereby forming aligning respective storage pockets to store integrated chips therebetween.

17. The tray for integrated circuit chips of claim 16 wherein when a lower tray is stacked and aligned with an upper tray whereby integrated chips are stored therebetween, storage pockets of an upper side of the lower tray include ridges to engage a first pair of diagonally opposing corners of chips stored between the trays and storage pockets of a lower side of the upper tray include ridges to engage a second pair of diagonally opposing corner of chips stored between the trays thereby stabilizing the chips in directions parallel to the trays.

18. The tray for integrated circuit chips of claim 17 whereby said first pair of diagonal corners of chips is engaged by ridges of the lower tray and said second pair of diagonal corners of chips are engaged by ridges of the upper tray, thereby making a resulting configuration flippable.

19. The tray for integrated circuits of claim 18 wherein chips stored between an upper and a lower tray are engaged between said ledges of said support elements of the upper and lower trays thereby stabilizing the chips in a direction perpendicular to the tray.

20. The tray for integrated circuit chips of claim 19 wherein said support elements on said upper side are directly above said support elements on said lower side, wherein support elements without said ridges are formed on said lower side immediately below support elements formed on said upper side with ridges, and wherein support elements with said ridges are formed on said lower side immediately below support elements formed on said upper side without ridges.

21. The tray for integrated circuit chips of claim 20 wherein X-shaped support elements are formed at an intersection of four storage pockets, T-shaped support elements are formed at an intersection of two storage pockets along sides of the tray and L-shaped support elements are formed at outward corners of corner storage pockets.

22. The tray for integrated circuit chips of claim 21 wherein said ridges are X-shaped on said X-shaped support elements, T-shaped on said T-shaped support elements and L-shaped on said L-shaped support elements.

23. The tray for integrated circuit chips of claim 22 wherein the tray is rectangular with rows and columns of storage pockets.

24. The tray for integrated circuit chips of claim 23 including a planar floor for supporting said support elements.

25. The tray for integrated circuit chips of claim 24 wherein said planar floor is solid through at least a portion of said storage pockets thereby forming vacuum storage pockets to permit vacuum operated equipment to couple to the tray.

* * * * *